(12) United States Patent
Eliason et al.

(10) Patent No.: US 8,963,343 B1
(45) Date of Patent: Feb. 24, 2015

(54) FERROELECTRIC MEMORIES WITH A STRESS BUFFER

(71) Applicant: Cypress Semiconductor Corporation, San Jose, CA (US)

(72) Inventors: Jarrod Eliason, Colorado Springs, CO (US); Lawrence Teresi, Gilbert, AZ (US); Fan Chu, Colorado Springs, CO (US); Philip Rochette, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/040,616

(22) Filed: Sep. 27, 2013

(51) Int. Cl.
*H01L 23/28* (2006.01)
*H01L 21/56* (2006.01)

(52) U.S. Cl.
CPC ............... *H01L 23/28* (2013.01); *H01L 21/56* (2013.01)
USPC .......................................................... 257/787

(58) Field of Classification Search
USPC .......................................................... 257/787
See application file for complete search history.

(56) References Cited

U.S. PATENT DOCUMENTS

| | | | |
|---|---|---|---|
| 5,026,667 A | | 6/1991 | Roberts, Jr. |
| 5,923,081 A * | | 7/1999 | Tandy ............................ 257/669 |
| 6,232,662 B1 * | | 5/2001 | Saran ............................. 257/750 |
| 6,387,795 B1 * | | 5/2002 | Shao .............................. 438/613 |
| 6,407,451 B2 * | | 6/2002 | Akram et al. ................. 257/698 |
| 6,791,168 B1 * | | 9/2004 | Connell et al. ................ 257/668 |
| 6,995,041 B2 * | | 2/2006 | Connell et al. ................ 438/112 |
| 7,223,630 B2 | | 5/2007 | Jeng |
| 7,427,813 B1 * | | 9/2008 | Wang et al. .................... 257/790 |
| 7,745,096 B2 * | | 6/2010 | Jung et al. .................. 430/270.1 |
| 8,058,677 B2 * | | 11/2011 | Summerfelt et al. .......... 257/295 |
| 8,436,460 B1 * | | 5/2013 | Gamboa et al. ............... 257/692 |
| 2002/0093107 A1 * | | 7/2002 | Wu et al. ....................... 257/780 |
| 2008/0203566 A1 * | | 8/2008 | Su .................................. 257/738 |
| 2009/0321964 A1 * | | 12/2009 | Summerfelt et al. .......... 257/787 |
| 2010/0295421 A1 * | | 11/2010 | Takeuchi et al. .............. 310/340 |
| 2011/0183471 A1 * | | 7/2011 | Summerfelt et al. .......... 438/117 |
| 2013/0119493 A1 * | | 5/2013 | Chou et al. .................... 257/417 |
| 2013/0292803 A1 * | | 11/2013 | Peng ............................. 257/620 |
| 2013/0295725 A1 * | | 11/2013 | Park et al. ..................... 438/124 |
| 2014/0176187 A1 * | | 6/2014 | Jayasena et al. ................ 326/39 |

OTHER PUBLICATIONS

Ranjan et al, "How buffer layers can provide stress management for wafer-level chip-scale packages" Solid State Technology—The International Magazine for Semiconductor Manufacturing, http://www.solid-state.com/display_article/209659/5/none/none/Feat/How-buffer-layers-can-provide-stress-management-for-wafer-level-chip-scale-package.*

* cited by examiner

*Primary Examiner* — Jarrett Stark
*Assistant Examiner* — Charles N Ausar-El

(57) ABSTRACT

A device including a ferroelectric memory and methods of manufacturing the same are provided. In one embodiment, the device includes a semiconductor die with an integrated circuit fabricated thereon, a stress buffer die mounted to the semiconductor die overlying the integrated circuit, and a molding compound encapsulating the semiconductor die and the stress buffer die. Generally the integrated circuit includes a ferroelectric memory. In some embodiments, the device further includes a polyimide layer between the stress buffer and the semiconductor die. Other embodiments are also provided.

15 Claims, 5 Drawing Sheets

US 8,963,343 B1

FERROELECTRIC MEMORIES WITH A STRESS BUFFER

TECHNICAL FIELD

This disclosure relates generally to fabrication of semiconductor devices, and more particularly to methods and structures for packaging devices that include integrated circuits with ferroelectric memories.

BACKGROUND

Ferroelectric memories or ferroelectric random access memories (F-RAM) provide non-volatile data storage through the use of a ferroelectric material which may be polarized in one direction or another in order to store a binary value.

Semiconductor devices, such as integrated circuits (ICs) including FRAM, are fabricated in or on a surface of a semiconductor substrate or wafer that is subsequently divided or diced into a number of discrete chips or dies each having a device or IC formed thereon. One or more dies are then enclosed in a package that provides physical and chemical protection of the die(s) while electrically connecting it with outside circuitry. One common type of package is a molded package in which the die is attached to a flag or die paddle of a lead frame, circuit elements on the die electrically coupled to conductors or lead fingers on the lead frame using a bonding wire, and the die and at least a portion of the lead frame encapsulated in a plastic molding compound using an injection or transfer molding process.

Molded packages provide a number of advantages including a lower per unit cost, and the ability to simultaneously package multiple dies in a sheet or a number of strips, which are subsequently divided to yield individually packaged devices or ICs. However, molded packages also suffer from a number of drawbacks or disadvantages.

In particular, signal margin of F-RAM is affected by the silica fillers ($SiO_2$ particles) in the mold compound of the package. The irregular or round shaped hard silica fillers in the mold compound form high stress points on the F-RAM die and consequently cause clusters of bits in the array showing low signal margin after the mold compound is cured. Polyimide deposited directly on a die has been used to eliminate local stress effects in some semiconductor devices other than those including F-RAM. However, in manufacturing or packaging devices including F-RAM the cure process of the polyimide coating results in a general degradation in signal margin due to an additional thermal budget.

SUMMARY

A device including a ferroelectric memory and methods of manufacturing the same are provided. In one embodiment, the device includes a semiconductor die with an integrated circuit fabricated thereon, a stress buffer die mounted to the semiconductor die overlying the integrated circuit, and a molding compound encapsulating the semiconductor die and the stress buffer die. Generally the integrated circuit includes a ferroelectric memory. In some embodiments, the stress buffer die includes a blank semiconductor die, such as a blank silicon die or wafer, without an integrated circuit or element fabricated thereon. In other embodiments, the device further includes a polyimide layer between the stress buffer and the semiconductor die.

BRIEF DESCRIPTION OF THE DRAWINGS

The present disclosure is illustrated by way of example, and not by way of limitation, in the figures of the accompanying drawings.

DETAILED DESCRIPTION

Embodiments of a semiconductor devices including a stress buffer die methods of fabricating, manufacturing or packaging the same are described herein with reference to figures.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
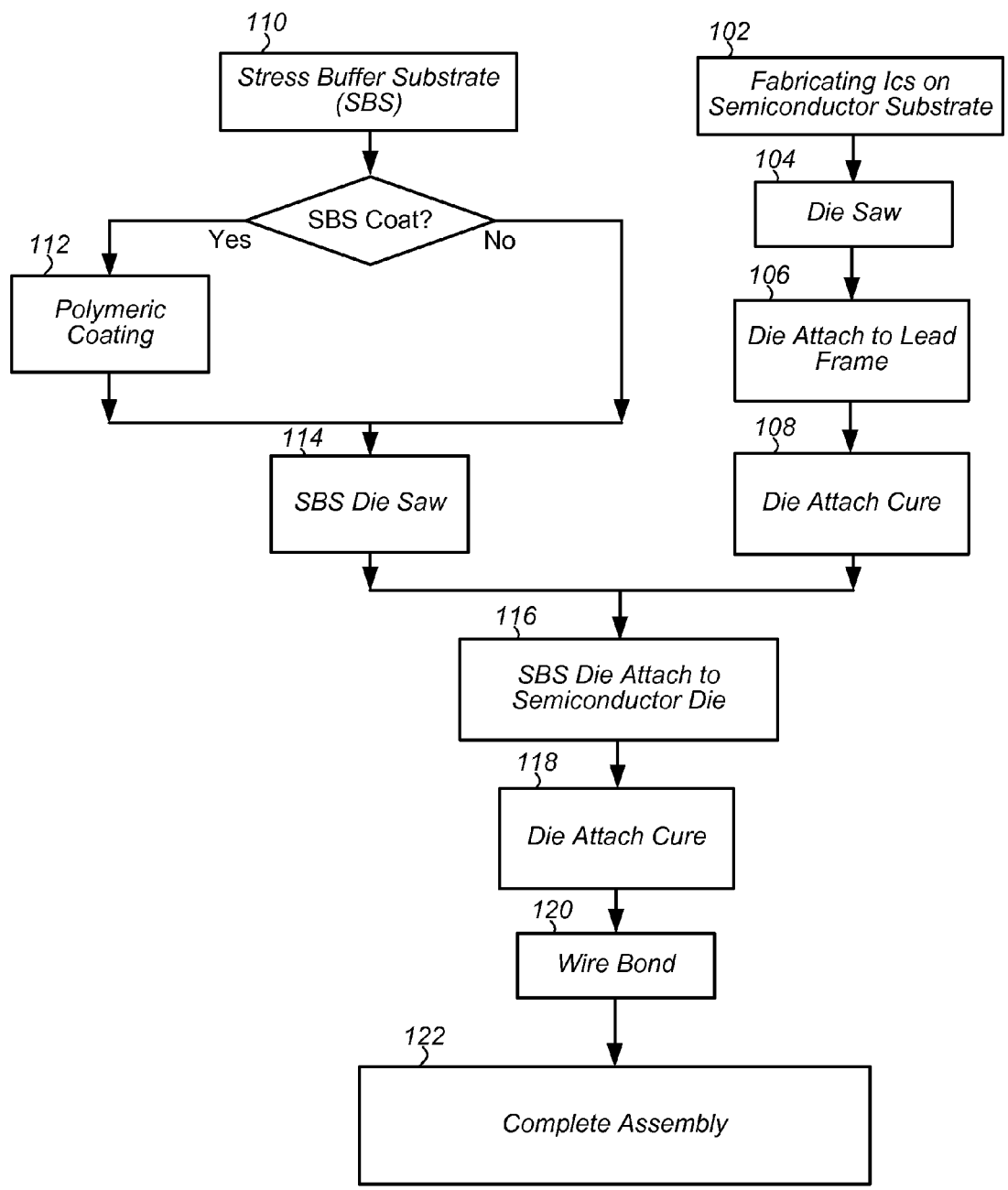
FIG. 1 is a flowchart of an embodiment of a process or method for manufacturing or packaging a semiconductor device including an stress buffer die according to the present disclosure.

An embodiment of a method for manufacturing or packaging a semiconductor device including a stress buffer die will now be described in detail with reference to FIG. 1 and FIGS. 2A through 2G. FIG. 1 is a flowchart illustrating an embodiment of a method or process flow for fabricating a semiconductor device including a stress buffer die. FIGS. 2A-2G are block diagrams illustrating the device during manufacturing or packaging of the device according to the method of FIG. 1.

Figure 2A:
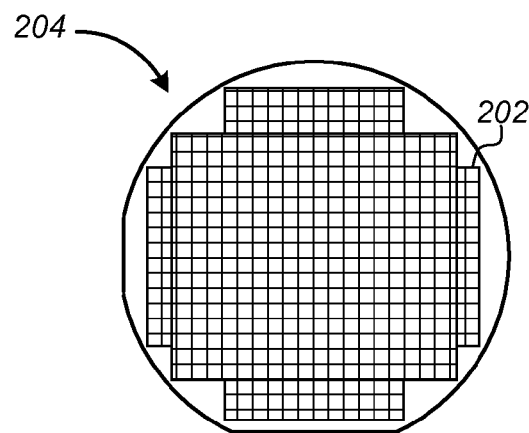
FIGS. 2A-G are block diagrams illustrating a semiconductor device including an stress buffer die during manufacturing or packaging of the device according to the method of FIG. 1.
Figure 2B:
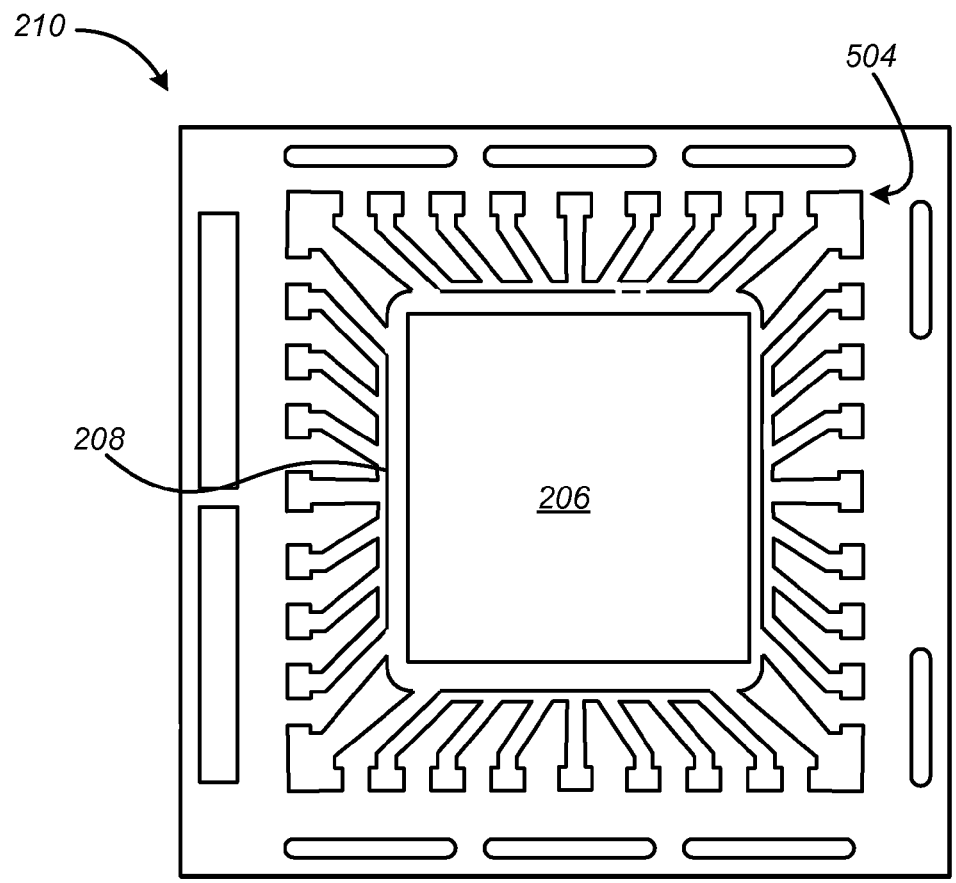
Figure 2C:
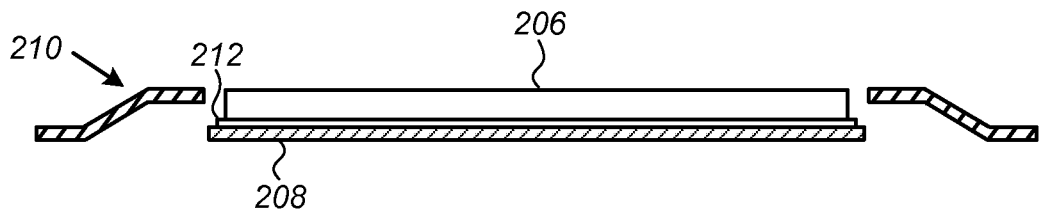

Referring to FIG. 1 and FIG. 2A, the process begins with fabricating one or more integrated circuits 202 in or on a surface of a semiconductor substrate 204 (step 102). The semiconductor substrate 204 can include any known semiconductor material, such as Silicon, Gallium-arsenide, Germanium, Gallium-nitride, Aluminum-phosphide, and mixtures or alloys thereof. In one embodiment, the semiconductor substrate 204 is a doped or undoped silicon-based semiconductor substrate, such as a monocrystalline silicon, silicon-germanium, silicon-on-insulator, or silicon-on-sapphire substrate.

The integrated circuits 202 or ICs can include complementary metal-oxide-semiconductor (CMOS) circuits and/or arrays of volatile or non-volatile memory cells. In one embodiment for which the structure and method of the present disclosure is particularly useful, the integrated circuits 202 are or include ferroelectric memory, such as ferroelectric random access memory (F-RAM). F-RAMs provide non-volatile data storage through the use of a ferroelectric material which may be polarized in one direction or another in order to store a binary value. This ferroelectric material exhibits piezoelectric properties making a device including an IC with a ferroelectric memory and packaged by a conventional method using a molding compound susceptible to high stress points induced in a surface of the ferroelectric material by irregular or round shaped hard silica fillers in the molding compound. As noted above, these high stress points induced in the surface of the ferroelectric material can cause clusters of bits in the ferroelectric memory to exhibit low signal margin after the mold compound is cured.

After the integrated circuits 202 are fabricated the semiconductor substrate 204 is diced using a die saw process to yield a number of separate semiconductor dies 206, each with one or more ICs formed thereon (step 104). Next, referring to FIGS. 1 and 2B, the semiconductor die 206 is attached a paddle 208 or flag of a lead frame 210 (step 106). The semiconductor die 206 can be attached to the lead frame 210 by any suitable means including solder or an adhesive. In certain embodiments, such as that shown in FIG. 2C, the semiconductor die 206 is attached to the lead frame 210 by a thin layer of adhesive 212, which is then cured or set in a die attach cure process (step 108). Suitable adhesives include, for example, standard die attach adhesives, such as Ablebond 8200TI die adhesive commercially available from Henkel Corporation, or EM-710 die attach film commercially available from Nitto Denko Corporation. Generally, the die attach cure process includes heating the assembled semiconductor die 206 and lead frame 210 to a temperature of from about 100° C. to about 250° C., for from about 30 seconds to about one hour.

Figure 2D:
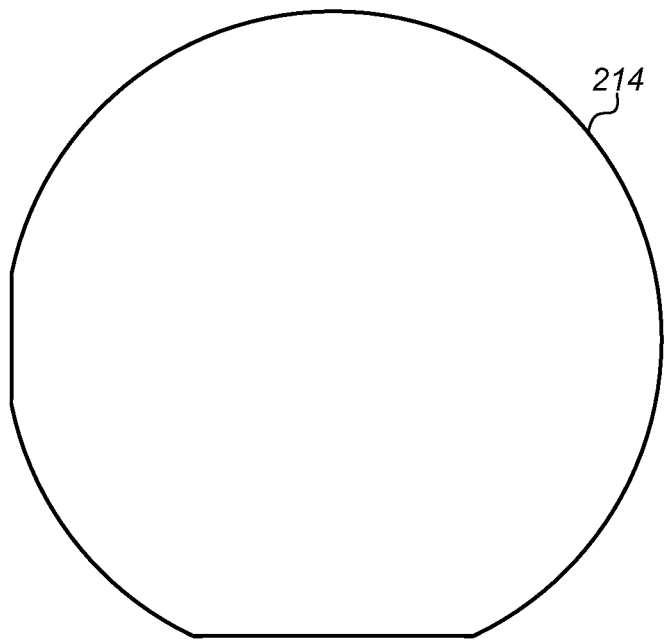

Referring to FIG. 1 and FIG. 2D, before, after or concurrent with the above steps a stress buffer substrate 214 or SBS is prepared (step 110), which will subsequently be diced to provide stress buffer die to protect the IC 202 on the semiconductor die 206 from point stress induced by fillers in the molding compound. Generally, the stress buffer substrate 214 can include any material having the desired mechanical properties, will not interfere with operation of the IC 202 and is compatible with standard packaging processes and molding compounds. Suitable materials for the stress buffer substrate 214 include a rigid material, such as glass, ceramics, polymers and/or substrates, such as those used in the manufacture of semiconductor devices as those described above for the semiconductor substrate 204. In one embodiment, the stress buffer substrate 214 includes a blank semiconductor substrate, such as a blank silicon wafer, without an integrated circuit element fabricated thereon.

Generally, preparing a blank semiconductor substrate to serve as the stress buffer substrate 214 includes lapping, grinding or polishing the substrate to reduce the thickness of the substrate to a thickness (T) of from about 3 mil to about 11 mil, or from about 70 µm to about 300 µm.

Optionally, as shown in FIG. 2D, preparing the blank semiconductor substrate to serve as the stress buffer substrate 214 can further include the step of forming one or more layer of polymeric material 216 on one or both surfaces of the stress buffer substrate 214 to further enhance the stress buffer effect (step 112). Generally, the polymeric material 216 can include any material having the desired mechanical properties, will not interfere with operation of the IC 202 and is compatible with standard packaging processes and molding compounds. Suitable materials for the stress buffer substrate 214 include a spin on polyimide coating, such as HD-7000, HD-8000 or HD-8820 series spin on polyimide coatings, commercially available from HD Microsystems, or Kapton® FIN or HPP-ST polyimide films or tape, commercially available from DuPont. Other suitable materials for the stress buffer substrate 214 include PBO (poly (p-phenylene benzoxazole)), silicon-gel and other soft or elastic insulating materials, which are commonly used for semiconductor fabrication and deposited using known techniques.

The spin on polyimide coatings are applied using a spin coater by dispensing a small amount of a liquid polyimide material on a surface of the stress buffer substrate 214 and rotating or spinning the substrate at high speed to spread out and dry the coating material by centrifugal force. After application of the polyimide, the coated stress buffer substrate 214 is baked from about 100° C. to about 350° C., for from about 60 seconds to about 1 hour on a hot plate to drive off carrier solvents to cure the polyimide layer. It will be appreciated that this embodiment, wherein the polyimide or polymeric material is deposited and cured on the stress buffer 214 provides significant advantages over conventional techniques in which polyimide is deposited and cured directly on a semiconductor die. In particular, it is noted that this embodiment eliminates the additional thermal budget associated with curing the polyimide, which can lead to outgassing of hydrogen and, if the ferroelectric material has already been polarized, can cause the material to imprint both of which can cause ferroelectric memories to exhibit low signal margin.

The polyimide films, such as Kapton® FIN or HPP-ST, are available as self-adhesive tape or as films that can be thermally adhered to the surfaces of the stress buffer substrate 214 by the adhesive.

In either embodiment used to form the polyimide layer, i.e., spin on polyimide coatings or polyimide films, the resultant film can have a thickness of from about 1 µm to about 100 µm, and in certain embodiments less than about 50 µm.

Figure 2E:
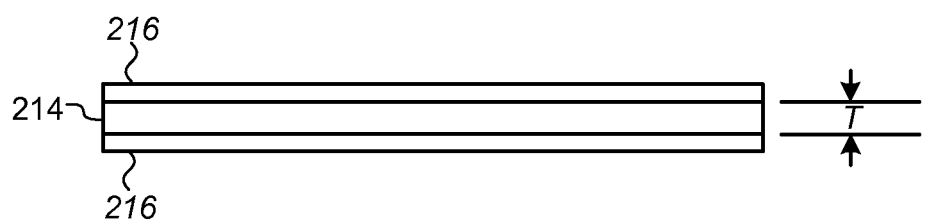

Next, referring to FIGS. 1 and 2E, the stress buffer substrate 214 is diced using a die saw process to provide a number of stress buffer die 218 (step 114). The stress buffer die 218 is then attached to the semiconductor die 206 on the lead frame 210 overlying the integrated circuit 202 (step 116). The stress buffer die 218 is sized and positioned on the semiconductor die 206 to leave a number of contact pads 220 on the semiconductor die exposed for subsequent electrical interconnection to fingers or leads 222 on the lead frame 210. Generally, as with the attachment of the semiconductor die 206 to the lead frame 210 the stress buffer die 218 is attached to the semiconductor die 206 by a thin layer of adhesive 224, such as Ablebond 8200TI die adhesive or EM-710 die attach film, which is then cured or set in a die attach cure process (step 118).

Figure 2F:
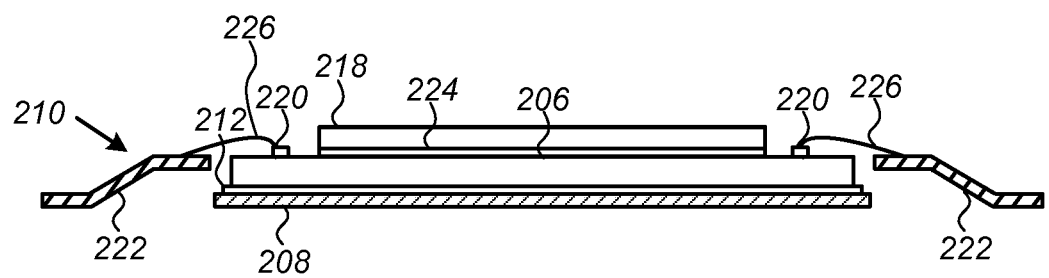

Referring to FIGS. 1 and 2F, the contact pads 220 on the semiconductor die 206 are electrically coupled to the leads 222 on the lead frame 210 by wire bonds 226 using a standard wirebonding process (step 120).

Figure 2G:
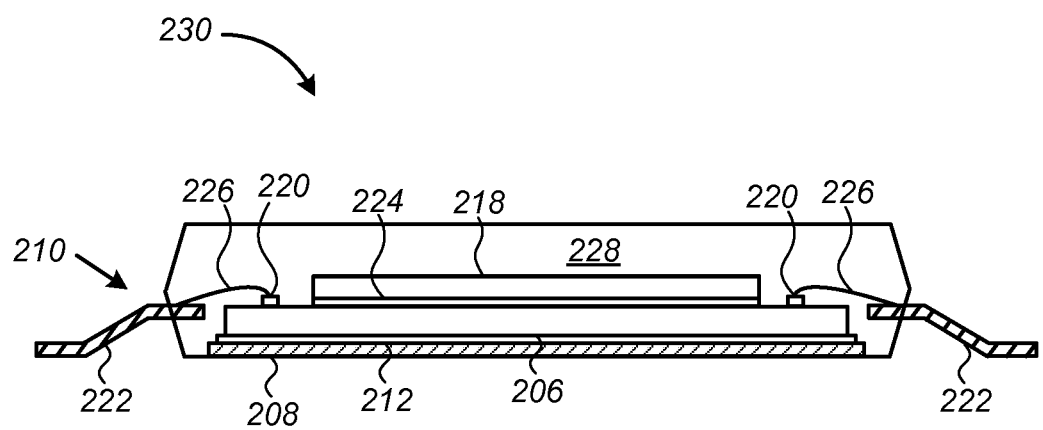

Finally, referring to FIGS. 1 and 2G, the rest of the assembly or packaging process is completed, including encapsulating the semiconductor die 206, the stress buffer die 218 and lead frame 210 in a molding compound 228, and curing the molding compound (step 122). Optionally, this step (step 122) can further include plating exposed portions of the leads 222. Alternatively, the lead frame 210 can include a pre-plated lead frame (PPF) in which the lead frame and/or leads 222 are pre-plated prior to assembly. FIG. 2G illustrates an embodiment of a packaged semiconductor device 230 in sectional side view including a stress buffer die 218 not including a layer of polymeric material 216, and mounted directly to a semiconductor die 206 by a thin layer of adhesive 224. Optionally, in one embodiment the adhesive 224 by which the stress buffer die 218 is mounted to the semiconductor die 206 is or may itself include a polymeric material, such as polyimide.

Various other embodiments of a packaged semiconductor device including a stress buffer die according to the present disclosure will now be described with reference to FIGS. 3A to 3C.

Figure 3A:
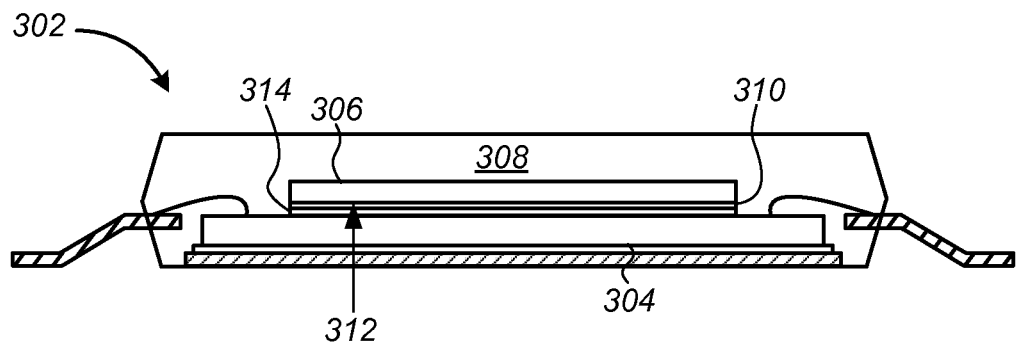
FIGS. 3A-C are block diagrams illustrating cross-sectional side views of a packaged semiconductor device including an stress buffer die according to various embodiments of the present disclosure.

Referring to FIG. 3A, in a first embodiment the device 302 includes a semiconductor die 304 with an integrated circuit fabricated thereon, a stress buffer die 306 mounted to the semiconductor die overlying the integrated circuit, and a molding compound 308 encapsulating the semiconductor die and the stress buffer die. The stress buffer die 306 further includes a layer of polymeric material 310 on a first surface 312 mounted to the semiconductor die 304 by an adhesive 314. In some embodiments the layer of polymeric material 310 can include a polyimide layer as described above.

Figure 3B:
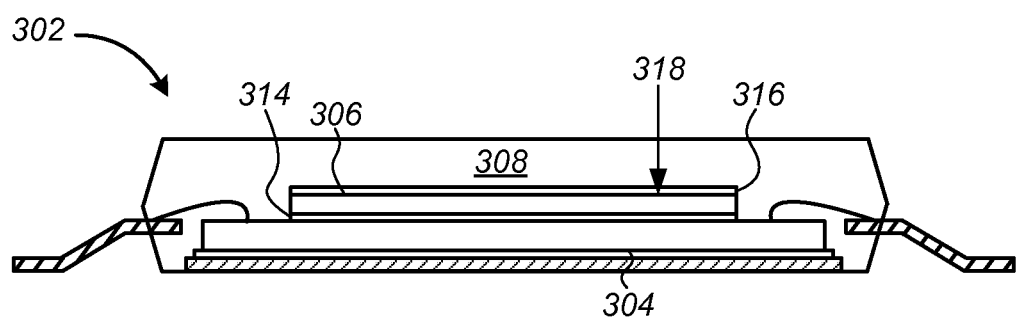

Referring to FIG. 3B, in a second embodiment the stress buffer die 306 further includes a layer of polymeric material 316 on a second surface 318, opposite the first surface 312. In some embodiments the layer of polymeric material 316 can include a polyimide layer as described above. In other embodiments the adhesive 314 by which the stress buffer die 306 is mounted to the semiconductor die 304 may itself include a polymeric material, such as polyimide, to further enhance the stress buffer effect.

Figure 3C:
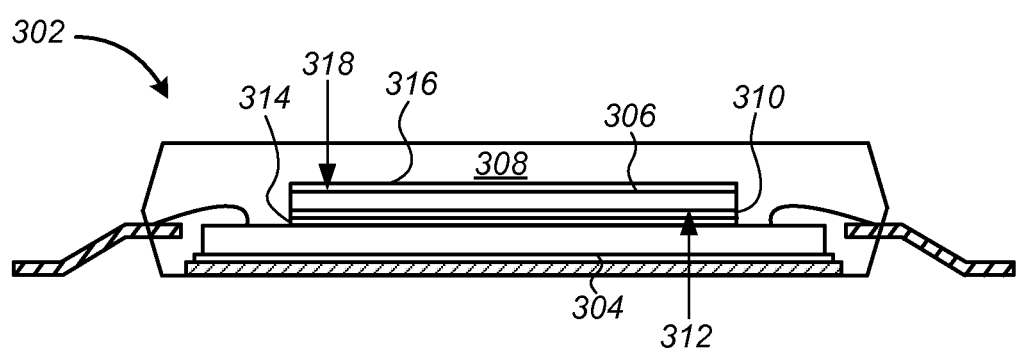

Referring to FIG. 3C, in a third embodiment the stress buffer die 306 further includes a first layer of polymeric material 310 on the first surface 312 and a second layer of polymeric material 316 on the second surface 318 and is mounted to the semiconductor die 304 by the adhesive 314. As in the embodiments described above the layers of polymeric material 310, 316 can include polyimide layers.

Thus, embodiments of ferroelectric memories and methods of manufacturing the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method comprising:
   fabricating an integrated circuit on a semiconductor die;
   depositing polymeric material on a first surface of a blank wafer and dicing the blank wafer to form a stress buffer die comprising a blank die and a layer of polymeric material on a first surface of the blank die;
   mounting the stress buffer die to the semiconductor die overlying the integrated circuit so that the layer of polymeric material on the first surface of the blank die electrically insulates the semiconductor die from the blank die; and
   encapsulating the semiconductor die and the stress buffer die with a molding compound,
   wherein the polymeric material comprises PBO (poly (p-phenylene benzoxazole)), and the blank die comprises a rigid material.

2. The method of claim 1, wherein the layer of polymeric material comprises a polyimide layer.

3. The method of claim 1, further comprising depositing polymeric material on a second surface of the blank wafer, opposite the first surface prior to dicing the blank wafer.

4. The method of claim 1, wherein fabricating an integrated circuit on a semiconductor die comprises fabricating an integrated circuit on a semiconductor wafer and dicing the semiconductor wafer to form the integrated circuit on the semiconductor die prior to mounting the stress buffer die to the semiconductor die.

5. The method of claim 1, further comprising baking the polymeric material on the first surface of the stress buffer die prior to mounting the stress buffer die to the semiconductor die.

6. The method of claim 1, further comprising reducing a thickness of the blank wafer to a thickness of from about 70 µm to about 300 µm prior to depositing polymeric material on the first surface of the blank wafer.

7. The method of claim 1, wherein the polymeric material comprises an adhesive by which the stress buffer die is mounted to the semiconductor die.

8. The method of claim 7, wherein mounting the stress buffer die to the semiconductor die further comprises a die attach cure process in which the adhesive is cured.

9. The method of claim 1, wherein the blank silicon die is electrically insulated from the semiconductor die by the polymer.

10. The method of claim 1, wherein the stress buffer die is mounted to a first surface of the semiconductor die, and wherein mounting the stress buffer die to the semiconductor die comprises mounting the stress buffer die to the semiconductor die so that contact pads on the first surface of the semiconductor die remain exposed for subsequent electrical interconnection.

11. The method of claim 1, wherein the blank wafer comprises a glass, ceramic or a rigid polymeric material.

12. A method comprising:

depositing an elastic insulating material on a blank wafer;

dicing the blank wafer to form a stress buffer die comprising a blank die and a layer of elastic insulating material on a first surface of the blank die;

mounting the stress buffer die to a surface of a semiconductor die so that the elastic insulating material electrically insulates the blank die from an integrated circuit formed on the surface of the semiconductor die, and so that contact pads on the surface of the semiconductor die remain exposed; and encapsulating the semiconductor die and the stress buffer die with a molding compound.

13. The method of claim 12, further comprising attaching the semiconductor die to a lead frame prior to mounting the stress buffer die to the semiconductor die.

14. The method of claim 13, further comprising electrically coupling the contact pads on the surface of the semiconductor die to leads on the lead frame by a wirebonding process.

15. The method of claim 12, wherein the blank die comprises a glass, ceramic or a rigid polymeric material.

\* \* \* \* \*